（12） United States Patent
Wei

(10) Patent No.: US 8,331,087 B2
(45) Date of Patent: Dec. 11, 2012

(54) CONTAINER DATA CENTER

(75) Inventor: Chao-Ke Wei, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 133 days.

(21) Appl. No.: 12/962,578

(22) Filed: Dec. 7, 2010

(65) Prior Publication Data

US 2012/0103843 A1    May 3, 2012

(30) Foreign Application Priority Data

Nov. 2, 2010   (CN) .......................... 2009 9 0137675

(51) Int. Cl.
*H05K 7/20* (2006.01)

(52) U.S. Cl. ................ 361/679.5; 361/679.47; 361/697; 454/184; 174/520

(58) Field of Classification Search ................ 361/679.46–679.51, 679.54, 676, 361/688–697, 701–704, 707, 709
See application file for complete search history.

(56) References Cited

U.S. PATENT DOCUMENTS

| | | | | |
|---|---|---|---|---|
| 6,119,768 | A * | 9/2000 | Dreier et al. | 165/104.33 |
| 6,478,082 | B1 * | 11/2002 | Li | 165/185 |
| 7,961,463 | B2 * | 6/2011 | Belady et al. | 361/695 |
| 2006/0002084 | A1 * | 1/2006 | Wei | 361/695 |
| 2008/0055846 | A1 * | 3/2008 | Clidaras et al. | 361/687 |
| 2008/0291626 | A1 * | 11/2008 | Nelson et al. | 361/696 |
| 2009/0241578 | A1 * | 10/2009 | Carlson et al. | 62/259.2 |

* cited by examiner

*Primary Examiner* — Courtney Smith
(74) *Attorney, Agent, or Firm* — Altis Law Group, Inc.

(57) ABSTRACT

A container data center includes a mobile container, a support plate installed in the container adjacent and parallel to a bottom wall of the container. Also included are two server systems arranged on the support plate in two parallel rows and a number of brackets installed between the bottom wall and the support plate. Additionally, a blower is installed between the bottom wall and the support plate, and two heat exchangers are provided at opposite sides of the blower. Each of the brackets comprises a number of columns. Each of the columns defines an air channel facing the blower.

10 Claims, 2 Drawing Sheets

CONTAINER DATA CENTER

BACKGROUND

1. Technical Field

The present disclosure relates to a container data center.

2. Description of Related Art

With increasing heavy duty use of on-line applications, the need for computer data centers has increased rapidly. Data centers are centralized computing facilities that include a mobile container, many server racks or shelves received in the container and holding many servers. One rack or shelf with some servers can be considered a server system. In the container, several server systems may be positioned on the floor of the container, which is not conducive to good heat dissipation and does not provide good protection from vibrations of the mobile container.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
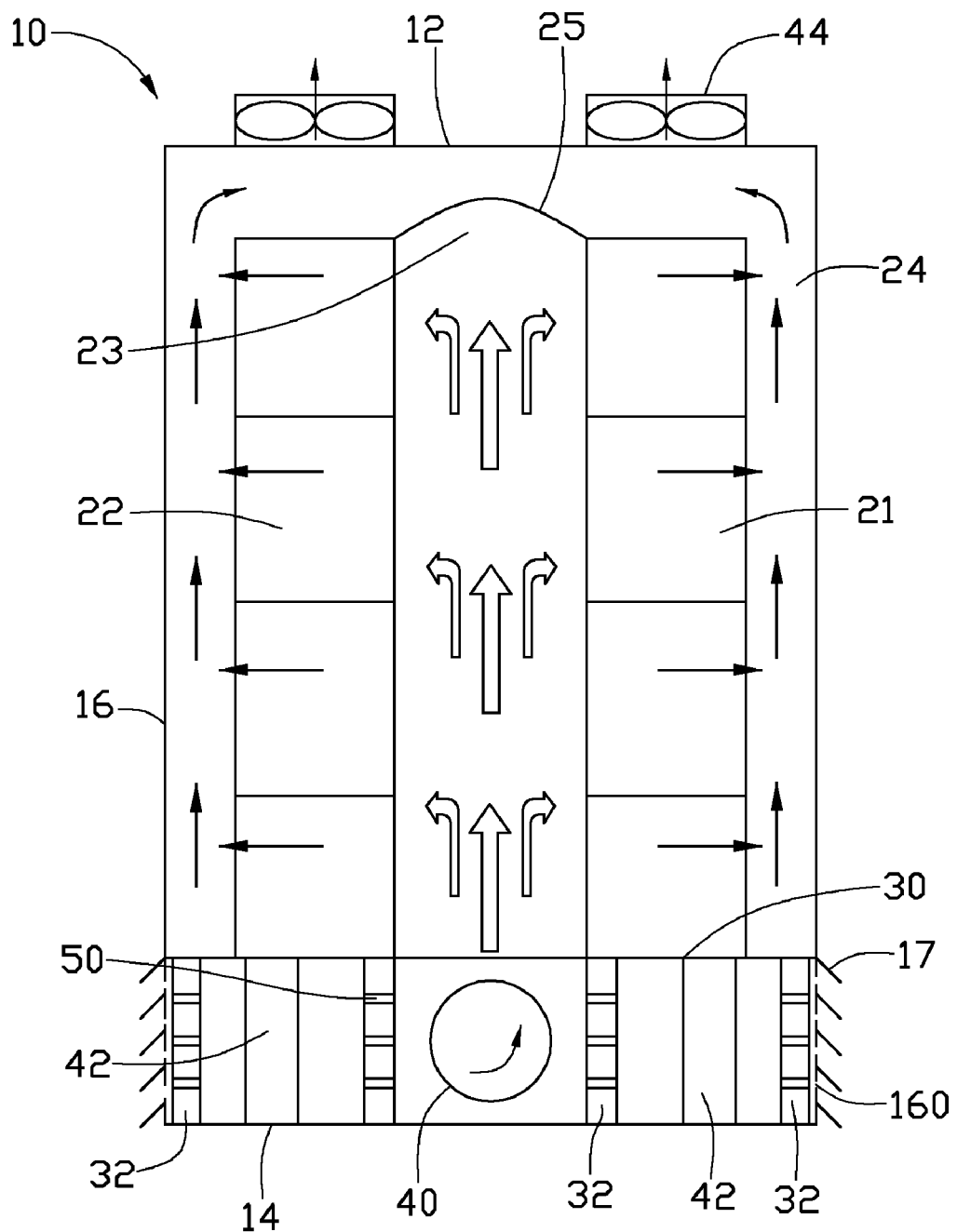
FIG. 1 is a schematic view of an exemplary embodiment of a container data center, the container data center includes a plurality of brackets.

Referring to FIG. 1, an embodiment of a container data center includes a mobile container 10, and two server systems 21 and 22. The container 10 includes a top wall 12, a bottom wall 14 opposite to the top wall 12, and a sidewall 16 substantially perpendicularly connected between the top wall 12 and the bottom wall 14.

The container data center further includes a support plate 30, a plurality of brackets 32, a blower 40, two heat exchangers 42, and two exhaust fans 44. The support plate 30 is installed in the container 10, adjacent to and parallel to the bottom wall 14 of the container 10, and extending to the sidewall 16 of the container 10. The brackets 32 are mounted to the bottom wall 14 to support the support plate 30. The blower 40 is installed on the bottom wall 14, between the support plate 30 and the bottom wall 14. The heat exchangers 42 are installed on the bottom wall 14, between the support plate 30 and the bottom wall 14 at opposite sides of the blower 40. The exhaust fans 44 are arranged on the top wall 12 of the container 10. The server systems 21 and 22 are arranged on the support plate 30 in two parallel rows between the support plate 30 and the top wall 12. Tops of the server systems 21 and 22 are connected by a heat shield 25.

In the container data center, there is a cold aisle 23 defined among the server systems 21 and 22, the support plate 30, and the heat shield 25. A hot aisle 24 defined among the server systems 21 and 22, the support plate 30, the heat shield 25, and the sidewall 16 of the container 10 (in FIG. 1 the large hollow arrows indicate cold airflow, and the small solid arrows indicate warm or hot airflow). The heat shield 25 can separate the cold aisle 23 from the hot aisle 24.

The sidewall 16 defines a plurality of ventilation holes 160 therein under the support plate 30. In this embodiment, the sidewall 16 defines a plurality of anti-backflow sheets 17 slantingly extending from the sidewall 16 positioned above the corresponding ventilation holes 160, to prevent rain water entering the container 10. Each ventilation hole 160 is regular hexagon shaped. All of the ventilation holes 160 are arranged in a honeycomb pattern.

Figure 2:
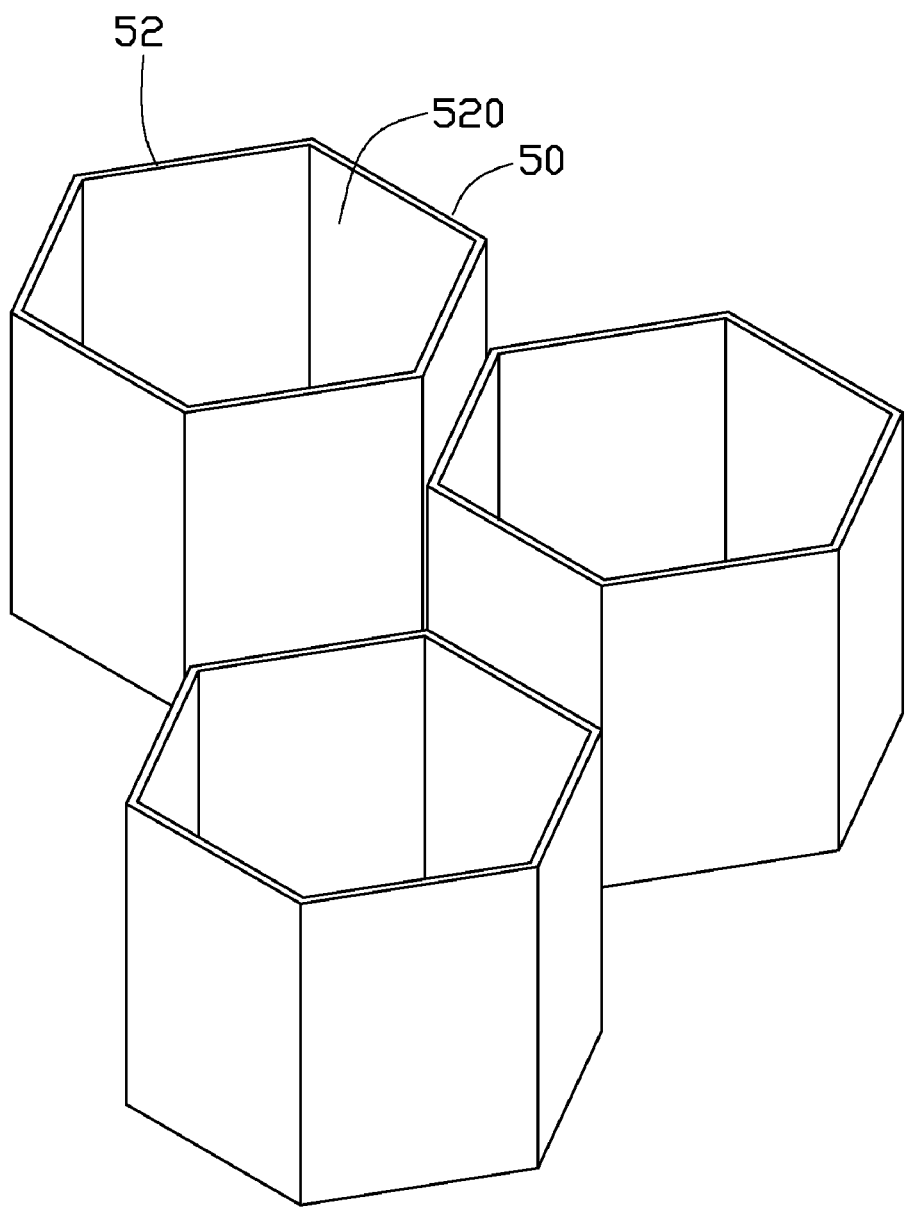
FIG. 2 is a schematic view of some of the brackets of FIG. 1.

Referring to FIG. 2, each bracket 32 includes a plurality of hollow regular hexagon shaped columns 50. Each column 50 includes six sidewalls 52 bounding an air channel 520 substantially parallel to the bottom wall 14. All of the columns 50 are arranged in a honeycomb pattern in a first direction perpendicular to an extending direction of the air channels 520, and all of the columns 50 are staggeredly arranged in a second direction along the extending direction of the air channels 529.

In use, the blower 40 sucks air through the ventilation holes 160 and the air channels 520 of the brackets 32 into the heat exchangers 42. The heat exchangers 42 cool the air, and then the cooled air is blown into the cold aisle 23 by the blower 40 to cool the server systems 21 and 22. Heat generated by the server systems 21 and 22 is dissipated into the hot aisle 24, and hot airflow in the hot aisle 24 is exhausted by the fans 44 to outside of the container 10. Because the sidewall 16 adopts honeycomb-shaped ventilation holes 160, more air can enter the container 10 to sufficiently dissipate heat generated by the server systems 21 and 22. The honeycomb-shaped columns 50 can increase the flexibility of the brackets 32 to help cushion or protect the server systems 21 and 22 from vibrations of the container data center.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. A container data center comprising:
a mobile container comprising a bottom wall;
a support plate installed in the container, adjacent and parallel to the bottom wall of the container;
two server systems arranged in the container and supported on the support plate in two parallel rows;
a plurality of brackets installed between the bottom wall and the support plate, opposite to the server systems;
a blower installed on the bottom wall, between the support plate and the bottom wall; and
two heat exchangers installed between the bottom wall and the support plate and at opposite sides of the blower;
wherein each of the plurality of brackets comprises a plurality of columns to increase flexibility of the brackets to help cushion or protect the server systems from vibrations of the container data center, each of the plurality of columns defines an air channel facing the blower.

2. The container data center of claim 1, wherein an extension direction of the air channels of the plurality of brackets is substantially parallel to the bottom wall.

3. The container data center of claim 2, wherein each of the plurality of columns comprises six sidewalls bounding the corresponding air channel, the plurality of columns of each bracket are arranged like a honeycomb in a first direction substantially perpendicular to the extension direction of the air channels of the columns.

4. The container data center of claim 3, wherein the plurality of columns of each bracket is staggeredly arranged in a second direction along the extension direction of the air channels.

5. The container data center of claim 2, wherein the container further comprises a sidewall substantially perpendicularly extending up from a side of the bottom wall, the sidewall of the container defines a plurality of ventilation holes, the extension direction of the air channels direct to the plurality of ventilation holes.

6. The container data center of claim 5, wherein the plurality of ventilation holes is positioned under the support plate.

7. The container data center of claim 6, wherein a plurality of anti-backflow sheets slantingly extends down from the sidewall of the container, above corresponding ventilation holes.

8. The container data center of claim 1, wherein a heat shield is connected between tops of the server systems, a cold aisle is defined among the server systems, the heat shield, and the support plate, a hot aisle is defined among a sidewall of the container, the server systems, the heat shield, and the support plate, tops of the server systems are connected by a heat shield to separate the cold aisle from the hot aisle.

9. The container data center of claim 1, wherein the container further comprises a top wall opposite to the support plate, two exhaust fans are arranged on the top wall.

10. The container data center of claim 8, wherein the container further comprises two sidewalls substantially perpendicularly extending up from two opposite sides of the bottom wall and a top wall connected between tops of the sidewalls and opposite to the support plate, an exhaust fan is arranged on the top wall, the sidewalls of the container each define a plurality of ventilation holes located between the support plate and the bottom wall, the blower sucks air through the ventilation holes and the air channels of the brackets into the heat exchangers, the heat exchangers cool the air, and then the cooled air is blown into the cold aisle by the blower to cool the server systems, heat generated by the server systems is dissipated into the hot aisle, and hot airflow in the hot aisle is exhausted by the exhaust fan to outside of the container.

* * * * *

UNITED STATES PATENT AND TRADEMARK OFFICE
CERTIFICATE OF CORRECTION

PATENT NO. : 8,331,087 B2  Page 1 of 1
APPLICATION NO. : 12/962578
DATED : December 11, 2012
INVENTOR(S) : Chao-Ke Wei It is certified that error appears in the above-identified patent and that said Letters Patent is hereby corrected as shown below:

On the Title Page, please replace Item (30) regarding "Foreign Application Priority Data" with the following:

(30)   Foreign Application Priority Data

Nov. 2 2010   (TW) .........................99137675

Signed and Sealed this
Thirty-first Day of December, 2013

Margaret A. Focarino
*Commissioner for Patents of the United States Patent and Trademark Office*